Figure 2:
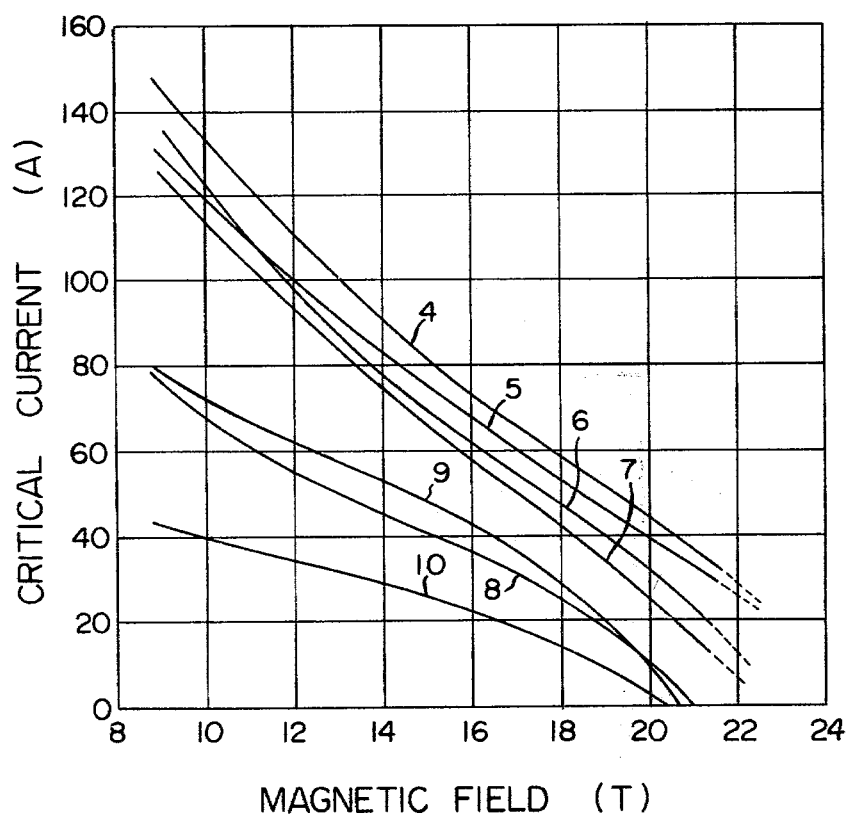

United States Patent [19]

Tachikawa et al.

[11] 4,274,889
[45] Jun. 23, 1981

[54] METHOD FOR PRODUCING SUPERCONDUCTORS

[75] Inventors: Kyoji Tachikawa, Tokyo; Yoshiaki Tanaka, Sakura; Yuji Yoshida, Sakura; Toshihisa Asano, Sakura, all of Japan

[73] Assignee: National Research Institute for Metals, Tokyo, Japan

[21] Appl. No.: 151,758

[22] Filed: May 20, 1980

Related U.S. Application Data

[63] Continuation of Ser. No. 10,123, Feb. 7, 1979, abandoned.

[30] Foreign Application Priority Data

Apr. 3, 1978 [JP] Japan ................................ 53/38154

[51] Int. Cl.$^3$ ............................................. H01L 39/24
[52] U.S. Cl. ..................................... 148/133; 29/599; 148/11.5 Q
[58] Field of Search ................... 148/11.5 R, 11.5 F, 148/11.5 Q, 127, 133; 29/599

[56] References Cited

U.S. PATENT DOCUMENTS

| 3,778,894 | 12/1973 | Kono et al. ........................ 148/127 |
| 3,836,404 | 9/1974 | Strauss ............................ 148/11.5 R |
| 3,926,684 | 12/1975 | Howe ............................ 148/11.5 F X |
| 3,930,903 | 1/1976 | Randall et al. ..................... 29/599 X |
| 4,002,504 | 1/1977 | Howe ............................... 148/11.5 R |
| 4,094,059 | 6/1978 | Tachikawa et al. ................ 29/599 X |
| 4,190,701 | 2/1980 | Howe et al. ................. 148/11.5 Q X |

FOREIGN PATENT DOCUMENTS

47-21356 6/1972 Japan .
52-1277 1/1977 Japan .
52-1278 1/1977 Japan .

OTHER PUBLICATIONS

Otto, "Superconductivity of Some Solid Solutions Between Compounds of A15 Structure on Vanadium Base", *Z. Physik,* 218, pp. 52–55, (1969).

Howe et al., "Superconducting Properties of $V_3Ga$ Composite Wires", *IEEE Transactions on Magnetics,* vol. Mag.-11, No. 2, Mar. 1975, pp. 251–254.

Yoshida et al., "Improved Composite-Processed $V_3Ga$ through Partial Substitution of Aluminum for Gallium in the Matrix", *Applied Physics Letters,* vol. 27, No. 11, Dec. 1975, pp. 632–634.

*Primary Examiner*—Peter K. Skiff
*Attorney, Agent, or Firm*—Fitzpatrick, Cella, Harper & Scinto

[57] ABSTRACT

In a method for producing $V_3Ga$ superconductors which comprises forming a composite of a core portion and a sheath portion surrounding said core portion, said sheath portion being composed of a gallium-containing alloy selected from the group consisting of copper-gallium and copper-silver-gallium alloys, and said core portion being composed of a vanadium metal, elongating said composite, and heat-treating the resulting elongated composite to form a $V_3Ga$ layer between said sheath and core portions; the improvement wherein the gallium-containing alloy has a gallium content of 0.1 to 30 atomic percent and additionally contains at least one metal selected from the group consisting of 0.05 to 5 atomic percent of magnesium, 0.5 to 10 atomic percent of aluminum, 0.1 to 10 atomic percent of cerium and 0.05 to 10 atomic percent of sodium, and the vanadium metal is a vanadium alloy containing 0.1 to 15 atomic percent of gallium.

14 Claims, 5 Drawing Figures

Fig. 1-a 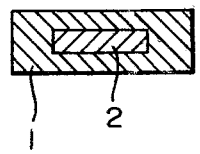
Fig. 1-b 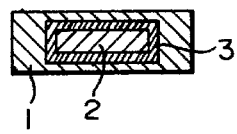

METHOD FOR PRODUCING SUPERCONDUCTORS

This is a continuation, of application Ser. No. 10,123, filed Feb. 7, 1979, now abandoned.

This invention relates to a method for producing a $V_3Ga$ superconductor, especially a $V_3Ga$ superconductor suitable for generating a strong magnetic field such as the one required in a nuclear fusion reactor.

Nb-Ti type alloy wires have been used heretofore as superconducting wires for the generation of a strong magnetic field. However, the magnetic field generated by these wires is of 80,000 to 85,000 gauss [corresponding to 8 to 8.5 tesla (T for short)] at the highest, and compound superconductors must be used to generate a strong magnetic field of 10 T or more which is required, for example, in a nuclear fusion reactor.

$V_3Ga$ compound is known as a superconducting material which meets this need, and some methods have been suggested in the past to draw it into wires. They include, for example, a method of producing a wire having a $V_3Ga$ layer which comprises passing a vanadium wire through molten gallium to form an intermetallic compound layer containing more Ga than $V_3Ga$ on the surface of the wire, plating Cu, Au or Rh on the intermetallic compound layer, and heat-treating the plated product (Japanese Pat. No. 670,619); and a method for producing a $V_3Ga$ compound wire which comprises plastically fabricating (e.g., drawing) a composite of vanadium (one metallic ingredient of $V_3Ga$) or its alloy such as V-Ti alloy and an alloy containing metallic gallium (Ga), the other metallic ingredient, (such as Cu-Ga alloy) (Japanese Pat. Nos. 876,262 and 886,920; the method which we call a composite fabricating method). The composite fabricating method has a great utilitarian value because it enables the production of multi-purpose wires having various cross-sectional shapes such as a tape, multi-filamentary wire or hollow conductor, particularly the production of ultrathin, multi-filamentary wires having stable superconductivity against rapid variations in magnetic field. It has been shown by the disclosures of these patents and Japanese Pat. No. 930,704 which pertains to an improvement of the above patents that the addition of titanium, zirconium or hafnium to vanadium, one metallic ingredient of the composite, or the inclusion of a small amount of sodium, cerium or magnesium in an alloy (e.g., Cu-Ga alloy) containing metallic gallium, the other ingredient, would be effective for improving the superconducting characteristics of the composite.

In recent years, it has become increasingly important to develop superconducting wires having a high critical current within a strong magnetic field range of 15 to 20 T as wires for large-sized magnets capable of producing a strong magnetic field for use in nuclear fusion, high energy physics, energy storage, etc. To obtain a magnet capable of producing a high magnetic field, it is necessary to use superconducting wires having both a high upper critical magnetic field $H_{c2}$ and a high critical current density $J_c$ ($J_c$ is a value resulting from division of the critical current measured in a magnetic field by the cross-sectional area of the superconductor). A wire compound having a composition closer to the stoichiometrical composition is desired in order to increase the $H_{c2}$ of the superconducting wire, and decreasing the size of the crystal grains of the compound is desired in order to increase $J_c$.

It is an object of this invention therefore to provide a method for producing a $V_3Ga$ layer whose crystal grains are fine and in which the V:Ga atomic ratio is 3:1 from a composite consisting of a portion of a V-containing alloy and a portion of a Ga-containing alloy.

A particular object of the invention is to provide a superconducting wire having high $H_{c2}$ and $J_c$.

The objects of the invention are achieved by an improved method for producing $V_3Ga$ superconductors which comprises forming a composite of a core portion and a sheath portion surrounding said core portion, said sheath portion being composed of a gallium-containing alloy selected from the group consisting of copper-gallium and copper-silver-gallium alloys, and said core portion being composed of a vanadium metal, elongating said composite, and heat-treating the resulting elongated composite to form a $V_3Ga$ layer between said sheath and core portions; wherein the gallium-containing alloy has a gallium content of 0.1 to 30 atomic percent and additionally contains at least one metal selected from the group consisting of 0.05 to 10 atomic percent of magnesium, 0.05 to 5 atomic percent of aluminum, 0.1 to 10 atomic percent of cerium and 0.05 to 10 atomic percent of sodium, and the vanadium metal is a vanadium alloy containing 0.1 to 15 atomic percent of gallium.

The compositions of alloys in the present application are expressed in atomic percent.

The method of this invention is an improvement over the method which comprises plastically fabricating (e.g., drawing) a composite composed of V or a V-containing alloy and a Ga-containing alloy and heat-treating the fabricated composite to form a $V_3Ga$ layer, and its novel aspect resides in the dissolving of Ga in V, one metallic ingredient of the composite, to form a solid solution, and the dissolving of Mg, Al, Ce or Na in the alloy containing Ga, the other metallic ingredient, (Cu-Ga alloy or Cu-Ag-Ga alloy) to form a solid solution. By dissolving Ga in V, it is possible for the resulting $V_3Ga$ layer to have the desired stoichiometrical composition, i.e. V:Ga=3:1 (atomic ratio). The dissolving of Mg, Al, Ce or Na in the gallium-containing alloy enables the size reduction of crystal grains of $V_3Ga$ and the promotion of a diffusion reaction between V and Ga.

More specifically, the method for producing superconductors in accordance with this invention comprises making a Cu-Ga or Cu-Ag-Ga alloy containing Al, Mg, Ce or Na (to be referred to as a grain size reducing element) by a melting technique, separately making a solid solution of Ga in V (V alloy) by a melting technique, forming a composite of various shapes composed of the V alloy and the Ga alloy surrounding the V alloy, fabricating the composite into a wire tape or tube by wire drawing, rolling or tube drawing, and then heat-treating the fabricated composite thereby to diffuse Ga selectively into the V alloy and to form a continuous $V_3Ga$ compound layer on the interface between the two alloys. One characteristic feature of the present invention is the addition of Ga to V and the grain size reducing element to Cu-Ga or Cu-Ag-Ga alloy.

The structure or shape of the composite, the method of forming the composite, the method of fabricating the composite, the method of heat-treating the fabricated composite, and the conditions used in these methods are disclosed, for example, in the above-cited Japanese Pat. Nos. 876,262 and 886,926. The composite can also be produced by a powder metallurgical technique as disclosed in Japanese Laid-Open Pat. No. 3291/73.

In the method of this invention, the amount of Ga to be included in Cu or Cu-Ag alloy is 0.1 to 30 atomic percent, preferably 10 to 25 atomic percent. When the Ga content exceeds 30%, the fabricability of the Cu-Ga alloy is reduced, and fracture may occur during the fabricating step. When the Ga content is less than 0.1%, it is difficult to form the $V_3Ga$ compound by heat-treatment.

The amount of the element to be added to the gallium-containing alloy is 0.5 to 10 atomic percent, preferably 1 to 8 atomic percent, for Al; 0.05 to 5 atomic percent, preferably 0.1 to 3 atomic percent, for Mg; 0.1 to 10 atomic percent, preferably 0.2 to 5 atomic percent, for Ce; and 0.05 to 10 atomic percent, preferably 0.1 to 7 atomic percent for Na.

Two or more of these grain size reducing elements may be used together. In this case, the total amount of these elements should desirably be 10 atomic percent at most in order to obtain a marked effect of reducing the size of crystal grains of $V_3Ga$ and rendering the grain shape isotropic and to retain good fabricability of the Ga alloy. If the amount of the element to be added to the Ga alloy is less than 0.5 atomic percent for Al, less than 0.05 atomic percent for Mg, less than 0.1 atomic percent for Ce, and less than 0.05 atomic percent for Na, the size reduction of crystal grains and the promotion of the diffusing reaction are not satisfactory.

When the amount of gallium to be added to the V alloy is within the range of 0.1 to 15 atomic percent, a $V_3Ga$ compound having a composition close to the stoichiometrical composition is formed, and therefore, $H_{c2}$ of the resulting product increases appreciably. Amounts of 0.5 to 6 atomic percent are especially preferred for the gallium addition from the standpoint of maintaining good fabricability of the V alloy.

When a Cu-Ag-Ga alloy is used, the content of Ag is not particularly critical. Usually, the amount of Ag is equal to, or smaller than, that of Cu.

As stated hereinabove, fine crystal grains of $V_3Ga$ can be produced by using a specified amount of at least one metal selected from the group consisting of Mg, Al, Ce and Na as a solid solution in a Cu-Ga alloy or a Cu-Ag-Ga alloy. Since the diffusion of Ga in V is effected through the crystal grain boundary of the $V_3Ga$ compound, the number of diffusion passages increases with decreasing size of the crystal grains, and thus the diffusion of Ga in V and the formation of $V_3Ga$ are promoted. Fine sizes of the crystal grains of $V_3Ga$ improve the $J_c$ of the resulting product.

Furthermore, the use of a specified amount of Ga as a solid solution in V can make the composition of the resulting $V_3Ga$ compound close to the stoichiometrical composition. When Ga is added to V, the crystalline structure of the resulting $V_3Ga$ usually becomes slightly anisotropic, and this causes the defect of increasing the anisotropy of $J_c$ with respect to the direction of the applied magnetic field. According to the method of this invention, the addition of Al, Mg, Ce and/or Na to the gallium alloy simultaneously with the addition of Ga to V makes it possible to afford products having an isotropic crystalline structure and isotropic $J_c$ as well as to reduce the size of the crystal grains of $V_3Ga$. This means that the $H_{c2}$ and $J_c$ of the $V_3Ga$ superconductor can be improved at the same time.

The superconductor in accordance with this invention is produced by fabricating the aforesaid composite composed of the Ga alloy and the V alloy into a wire, tape or tube by wire drawing, rolling or tube drawing, and heat-treating the fabricated composite at 450° to 900° C., preferably 500° to 750° C., for 1 minute to 300 hours, preferably 15 minutes to 150 hours. As a result of this heat-treatment, Ga diffuses selectively from the Ga-containing alloy to V to form a continuous $V_3Ga$ layer.

The $V_3Ga$ superconductors produced by the method of this invention have a high critical magnetic field. Moreover, the critical current in these superconductors in a strong magnetic field increases strikingly, and the critical current density in a strong magnetic field is at least about $5 \times 10^4$ A/cm² of the cross-section of the $V_3Ga$ layer. The use of the $V_3Ga$ wire in accordance with this invention makes it possible to produce a superconducting magnet capable of generating a magnetic field of about 20 tesla. The use of wires which permit such an increased critical current can give rise to a decrease in the number of windings of wire required to generate a specified magnetic field. This is advantageous in that the length of wire can be shortened, a small-sized light-weight magnet can be produced from the wire, the operability of the magnet can be improved, accessory devices such as a cryostat can be made small in size, and the amount of liquid helium required for colling can be reduced. The plastic fabricability of the V alloy and the Ga alloy as materials for the superconductors of this invention is equal to, or greater than, that of the materials for a composite in conventional methods such as the alloys disclosed in the above-cited Japanese Pat. Nos. 876,262 and 886,920. Wires can be easily produced from these materials by using conventional techniques.

In the accompanying drawings, FIG. 1-a schematically shows the cross-section of one example of a composite produced by the method of this invention, and FIG. 1-b schematically shows the cross section of a $V_3Ga$ superconductor obtained by heat-treating the composite shown in FIG. 1-a. In these Figures, the reference numeral 1 represents a Cu-Ga alloy, and 2, a vanadium alloy. In FIG. 1-b, the reference numeral 3 represents a $V_3Ga$ compound formed by heat-treatment.

Figure 3:
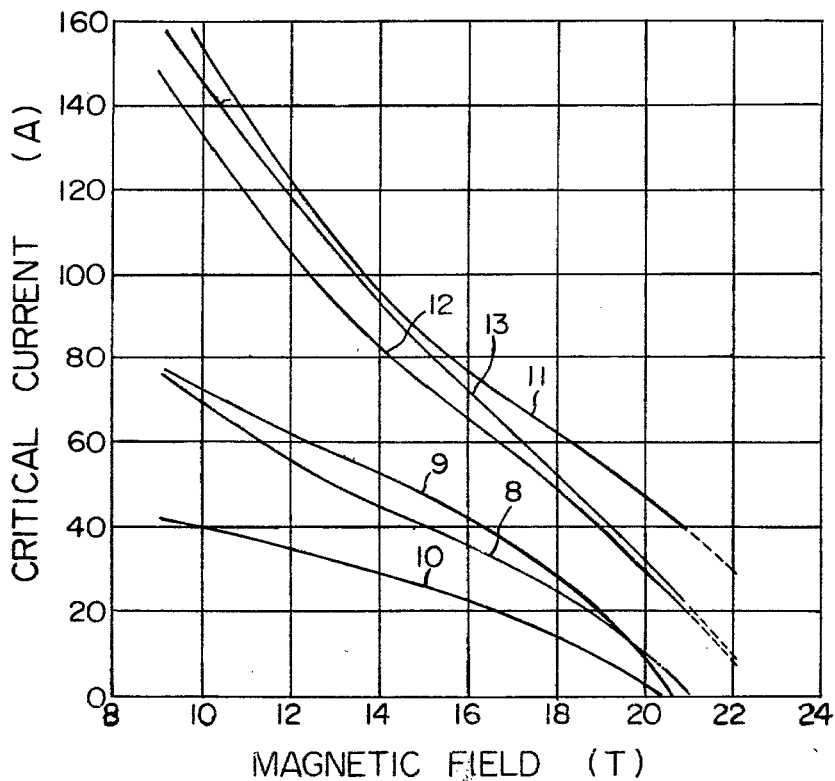
Figure 4:
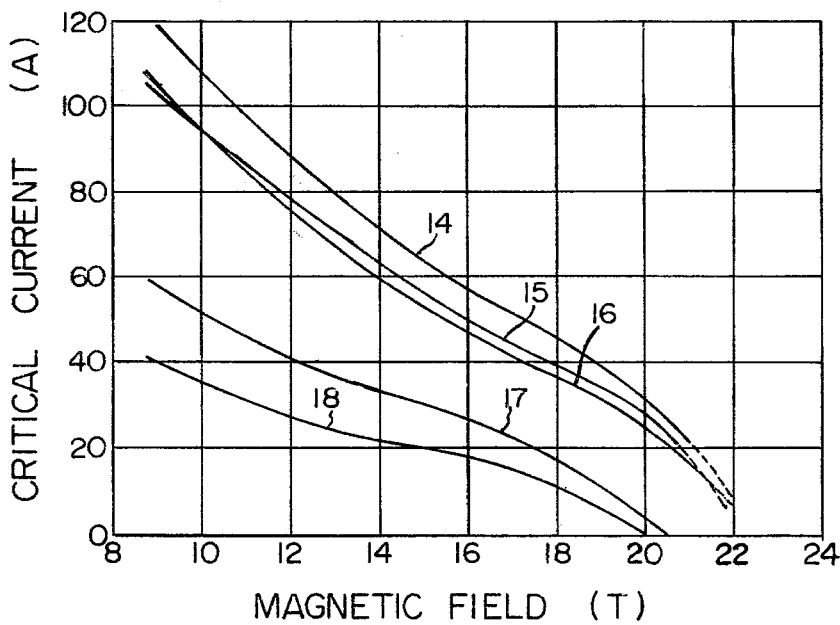

FIGS. 2, 3 and 4 are diagrams showing variations in the critical current of $V_3Ga$ superconductor wires against magnetic fields applied in liquid helium as compared with those of conventional samples.

The structure of the composite used in the method of this invention is not limited to the type shown in FIG. 1-a, and may include a so-called ultrathin multi-filamentary wire resulting from embedding multiple V alloy cores in a gallium alloy or a hollow body for further increasing the cooling effect by liquid helium. It may also be sandwich of the V alloy and the Ga alloy, or a composite consisting of a core of the Ga alloy and a sheath of the V alloy (corresponding to the structure in FIG. 1-a except that the sheath and the core are reversed).

The following Examples illustrate the present invention more specifically.

EXAMPLE 1

Ga (19 atomic percent) was blended with Cu, and the mixture was melted in the atmosphere in a Tanmann melting furnace, and 0.5 atomic percent of Mg was added. The melt was then cast in a mold to form an alloy rod having a diameter of 15 mm and a length of 100 mm. The rod was lathed into a Ga alloy tube having an outside diameter of 12.5 mm and an inside diameter of 5.5 mm.

In a similar manner, alloy tubes containing (1) Cu and 19 atomic percent of Ga, (2) Cu, 19 atomic percent of Ga and 1 atomic percent of Al, (3) Cu, 19 atomic percent of Ga and 0.7 atomic percent of Ce, or (4) Cu, 19 atomic percent of Ga and 1.5 atomic percent of Na, respectively were produced.

Separately, a material consisting of pure V and a material consisting of V and 3 atomic percent of Ga were respectively melted in an argon atmosphere in an arc melting furnace, and shaped to a diameter of 5.5 mm by rolling with grooved rolls and by swaging to produce a pure V rod and a V-Ga alloy rod.

The pure V rod or the alloy rod was inserted into each of the Ga alloy tubes to form composites. Each of the composites was rolled at room temperature first with grooved rolls to a 2.5 mm square shape, and then with flat rolls. The rolled composite was subjected to intermediate annealing in vacuum at 620° C. for about 30 minutes to form a tape having a thickness of 0.15 mm and a width of 5 mm (the V alloy as a core had a thickness of about 0.05 mm and a width of about 2.6 mm) and the cross-sectional shape shown in FIG. 1-a. Samples having a length of 30 mm were cut off from this tape in order to measure their superconducting characteristics, and heat-treated at 650° C. for 50 hours. The cross-sectional shape of the heat-treated tape is shown in FIG. 1-b.

Table 1 below summarizes various combinations of a Ga alloy and V or a V alloy, the thickness of the $V_3Ga$ layer, the size of $V_3Ga$ crystal grains measured by examining the fracture surface of the tape with a scanning electron microscope, and the critical current density ($J_c$) at a magnetic field strength of 9.5 T calculated from the critical current measured in a magnetic field of 9.5 T at 4.2° K. and the cross-sectional area of the $V_3Ga$ layer.

FIG. 2 shows the critical current (ordinate) of each sample versus the applied magnetic field (abscissa).

As is clearly seen from the data shown in Table 1, composite tapes (samples Nos. 1-1 to 1-4) composed of a V alloy and a Cu-Ga alloy contain a $V_3Ga$ layer having a thickness which is more than 20% larger than that in the composite tapes produced from a composite composed of pure V and a Cu-Ga alloy not containing the grain size reducing element (sample No. 1-7), the composite tape produced from a composite composed of a Ga-containing V alloy and a Cu-Ga alloy (sample No. 1-5), and the composite tape produced from a composite composed of pure V and a Cu-Ga alloy containing Mg (sample No. 1-6). Furthermore, the $V_3Ga$ crystal grains in the composite tapes of this invention are finer in size than in the comparative samples, and therefore, their critical currents and critical current densities increase strikingly.

TABLE 1

| Example | Sample No. | Amount (%) of Ga in V alloy | Amount (%) of additional element in Cu-Ga alloy | Thickness of the $V_3Ga$ layer (μm) | Diameter of the $V_3Ga$ crystal grains (μm) | Critical current density (A/cm²) (9.5 T) | Anisotropy of $J_c$ (9.5 T) $J_c(H_1)/J_c(H_{11})$ | Numbers of curves in FIGS. 2 and 3 |
|---|---|---|---|---|---|---|---|---|
| 1 | 1-1 | 3 | Mg (0.5) | 6.9 | 0.38 | $3.9 \times 10^5$ | 1.2 | 4 |
|   | 1-2 | 3 | Al (1) | 6.5 | 0.41 | $3.7 \times 10^5$ | 1.4 | 5 |
|   | 1-3 | 3 | Ce (0.7) | 6.7 | 0.39 | $3.7 \times 10^5$ | 1.5 | 6 |
|   | 1-4 | 3 | Na (1.5) | 6.4 | 0.40 | $3.6 \times 10^5$ | 1.3 | 7 |
|   | 1-5 | 3 | — | 5.0 | 0.53 | $2.8 \times 10^5$ | 3.2 | 8 |
|   | 1-6 | — | Mg (0.5) | 5.5 | 0.55 | $2.6 \times 10^5$ | 1.8 | 9 |
|   | 1-7 | — | — | 3.5 | 0.60 | $2.2 \times 10^5$ | 2.2 | 10 |
| 2 | 2-1 | 6 | Mg (0.5) Al (2) | 7.5 | 0.41 | $4.2 \times 10^5$ | 1.4 | 11 |
|   | 2-2 | 6 | Ce (0.3) Na (1.0) | 7.1 | 0.40 | $3.8 \times 10^5$ | 1.5 | 12 |
| 3 | 3-1 | 4 | Mg (0.5) Al (1) Na (0.5) | 7.4 | 0.39 | $4.0 \times 10^5$ | 1.4 | 13 |

It is seen from a comparison in FIG. 2 of curves 4 to 7 (invention) with curve 10 and curves 8 and 9 (outside the invention) that the composite tapes in accordance with this invention produce a critical magnetic field which is 1 to 3 T higher, and have an increased critical current; and that the increase of the critical current at a strong magnetic field of about 20 T is remarkable. The critical magnetic field of a $V_3Ga$ compound depends sensitively upon its composition. $V_3Ga$ compounds formed by the conventional composite methods contain 21 to 23 atomic percent of Ga which is smaller than the stoichiometrical amount (25 atomic percent) of Ga. Since the composition of $V_3Ga$ formed by using the V-Ga alloy in accordance with this invention is close to the stoichiometrical composition, a high $H_{c2}$ value can be obtained.

The anisotropy of $J_c$, which is the ratio of $J_c$ of a sample measured when a magnetic field of 9.5 T is applied perpendicular to its rolled surface to the $J_c$ of the sample measured when a magnetic field of the same strength is applied parallel to its rolled surface, as shown in Table 1, is much smaller in the composite tapes obtained by the present invention than the composite tape prepared from a composite containing no additional element both in the V metal and the Cu-Ga alloy and the composite tape prepared from a composite containing Ga in the V metal. This effect is attributed to the fact that in a wire prepared from a composite composed of a Ga-containing V alloy and a Cu-Ga alloy containing an additional element such as Mg, the shapes of the resulting $V_3Ga$ crystal grains are isotropic. The reduction of anisotropy permits easy designing of a superconducting magnet, and its effect in practical application is great.

EXAMPLE 2

Two Ga alloy tubes having an outside diameter of 12.5 mm and an inside diameter of 5.5 mm consisting of (1) Cu, 19 atomic percent of Ga, 0.5 atomic percent of Mg and 2 atomic percent of Al and (2) Cu, 19 atomic percent of Ga, 0.3 atomic percent of Ce and 1.0 atomic percent of Na were produced by the same melting and fabricating methods as in Example 1. Separately, a V alloy rod having a diameter of 5.5 mm was prepared from a V alloy having 6 atomic percent of Ga dissolved therein. The V alloy rod was inserted into each of the Ga alloy tubes to form a composite. The composites were plastically fabricated in the same way as in Example 1 to form tape samples having a thickness of 0.15 mm and a width of 5 mm (the V alloy as a core had a thickness of about 0.05 mm and a width of about 2.6 mm). These samples are designated as samples Nos. 2-1 and 2-2.

Short samples having a length of 30 mm were cut out from these tape samples, enclosed in a quartz tube in an argon gas atmosphere, and heat-treated at 650° C. for 50 hours to diffuse $V_3Ga$. The thickness of the $V_3Ga$ layer of each of the heat-treated samples, the diameter of the $V_3Ga$ crystal grains, and $J_c$ and its anisotropy in a magnetic field of 9.5 T are shown in Table 1. Variations in critical current against magnetic fields applied are shown in FIG. 3. Curves 11 and 12 show the results of this Example. It is seen that because the amount of Ga in the V alloy increased, the formation of a $V_3Ga$ compound having a stoichiometrical composition became easy, and $H_{c2}$ increased, and that by the addition of the grain size reducing elements to a Cu-Ga alloy, the size of the $V_3Ga$ crystal grains was reduced, and $J_c$ and the critical current value were significantly increased.

EXAMPLE 3

A composite having the same dimension as in Example 2 was prepared which consisted of a V alloy having dissolved therein 4 atomic percent of Ga and a Ga alloy composed of Cu, 19 atomic percent of Ga, 0.5 atomic percent of Mg, 1 atomic percent of Al and 0.5 atomic percent of Na and converting the V alloy. The composite was plastically fabricated and heat-treated in the same way as in Example 2 to form a $V_3Ga$ tape (designated as sample No. 3-1). The thickness of the $V_3Ga$ layer of the sample, the diameter of the $V_3Ga$ crystal grains and the critical current density ($J_c$) are shown in Table 1. Variations in critical current against the strength of the applied magnetic field are shown in curve 13 in FIG. 3. An increase in $H_{c2}$ and $J_c$ was obtained by the same effect as described in Examples 1 and 2.

EXAMPLE 4

Ga alloy tubes having an outside diameter of 12.5 mm and an inside diameter of 5.5 mm consisting of (1) Cu, 6 atomic percent of Ag, 12 atomic percent of Ga and as a grain size reducing element, 1 atomic percent of Mg, 2.5 atomic percent of Al or 1.5 atomic percent of Na were produced by the same melting and fabricating methods as described in Example 1.

Separately, a V alloy rod having 3 atomic percent of Ga dissolved therein was produced. The rod was inserted into each of the Ga alloy tubes to form a composite. The composite was rolled with grooved rolls and flat rolls, and repeatedly subjected to intermediate annealing in vacuum at 580° to 600° C. for about 30 minutes to form a tape having a thickness of 0.15 mm and a width of 5.5 mm (the V alloy as a core had a thickness of about 0.05 mm and a width of about 2.65 mm). Samples having a length of 30 mm were cut out from this tape in order to determine their superconducting characteristics, and heat-treated at 650° C. for 50 hours. Table 2 summarizes various combinations of Ga alloy and V alloy or pure V, the thickness of the $V_3Ga$ layer, the diameter of the crystal grains and the critial current density ($J_c$) in a magnetic field of 9.5 T at 4.2° K. The relation between the critical current (ordinate) of each sample and the magnetic field applied (abscissa) is shown in FIG. 4.

TABLE 2

| Example | Sample No. | Sample Amount (%) of Ga in V alloy | Amount (%) of additional element in Cu-Ag-Ga alloy | Thickness of the $V_3Ga$ layer (μm) | Diameter of the $V_3Ga$ crystal grains (μm) | Critical current density (A/cm$^2$) (9.5 T) | Anisotropy of $J_c$ (9.5 T) $J_c(H_1)/J_c(H_{11})$ | Number of curves in FIGS. 2 and 3 |
|---|---|---|---|---|---|---|---|---|
| 4 | 4-1 | 3 | Mg (1) | 5.9 | 0.40 | 3.5 × 10$^5$ | 1.3 | 14 |
|   | 4-2 | 3 | Al (2.5) | 5.5 | 0.42 | 3.4 × 10$^5$ | 1.5 | 15 |
|   | 4-3 | 3 | Na (1.5) | 5.4 | 0.43 | 3.4 × 10$^5$ | 1.5 | 16 |
|   | 4-4 | 3 | — | 3.7 | 0.53 | 2.8 × 10$^5$ | 3.1 | 17 |
|   | 4-5 | — | — | 2.8 | 0.58 | 2.5 × 10$^5$ | 2.0 | 18 |

It is clearly seen from the data given in Table 2 that in the composite tapes produced from a composite composed of V-Ga alloy and Ga alloy containing Mg, Al or Na (samples Nos. 4-1 to 4-3), the thickness of the $V_3Ga$ layer is about two times larger, and the critical current density ($J_c$) is more than about 20% higher than in the composite tape produced from a composite composed of pure V and Cu-Ag-Ga alloy (sample No. 4-5) and the composite tape produced from a composite composed of V-Ga alloy and Cu-Ag-Ga alloy (sample No. 4-4).

As shown in FIG. 4, $H_{c2}$ and the critical current increased markedly in curves 14 to 16 (samples Nos. 4-1 to 4-3) as compared with curves 18 (sample No. 4-5) and curve 17 (sample No. 4-4).

What we claim is:

1. In a method for producing $V_3Ga$ superconductors which comprises forming a composite of a core portion and a sheath portion surrounding said core portion, said sheath portion being composed of a gallium-containing alloy selected from the group consisting of copper-gallium and coppr-silver-gallium alloys, and said core portion being composed of a vanadium metal, elongating said composite, and heat-treating the resulting elongated composite to form a $V_3Ga$ layer between said sheath and core portions; the improvement wherein the gallium-containing alloy has a gallium content of 0.1 to 30 atomic percent and additionally contains at least one metal selected from the group consisting of 0.05 to 5 atomic percent of magnesium, 0.1 to 10 atomic percent of cerium and 0.05 to 10 atomic percent of sodium, and the vanadium metal is a vanadium alloy containing 0.1 to 15 atomic percent of gallium.

2. The method of claim 1 wherein the heat-treatment is carried out at a temperature of from 450° to 950° C.

3. The method of claim 1 wherein the heat-treatment is carried out for a period of time of from 1 minute to 300 hours.

4. The method of claim 1 wherein the gallium-containing alloy has a gallium content of 10 to 25 atomic percent.

5. The method of claim 1 wherein said gallium-containing alloy contains at least one metal selected from the group consisting of 0.1 to 3 atomic percent of magnesium, 0.2 to 5 atomic percent of cerium and 0.1 to 7 atomic percent of sodium.

6. The method of claim 1 wherein the maximum total amount of said metal in said gallium-containing alloy is 10 atomic percent.

7. The method of claim 1 wherein said vanadium alloy contains 0.5 to 6 atomic percent of gallium.

8. In a method for producing $V_3Ga$ superconductors which comprises forming a composite of a core portion and a sheath portion surrounding said core portion, said core portion being composed of a gallium-containing alloy selected from the group consisting of copper-gallium and copper-silver-gallium alloys, and said sheath portion being composed of a vanadium metal, elongating said composite, and heat-treating the resulting elongated composite to form a $V_3Ga$ layer between said sheath and core portions; the improvement wherein the gallium-containing alloy has a gallium content of 0.1 to 30 atomic percent and additionally contains at least one metal selected from the group consisting of 0.05 to 5 atomic percent of magnesium, 0.1 to 10 atomic percent of cerium and 0.05 to 10 atomic percent of sodium, and the vanadium metal is a vanadium alloy containing 0.1 to 15 atomic percent of gallium.

9. The method of claim 8 wherein the heat-treatment is carried out at a temperature of from 450° to 950° C.

10. The method of claim 8 wherein the heat-treatment is carried out for a period of time of from 1 minute to 300 hours.

11. The method of claim 8 wherein the gallium-containing alloy has a gallium content of 10 to 25 atomic percent.

12. The method of claim 8 wherein said gallium-containing alloy contains at least one metal selected from the group consisting of 0.1 to 3 atomic percent of magnesium, 0.2 to 5 atomic percent of cerium and 0.1 to 7 atomic percent of sodium.

13. The method of claim 8 wherein the maximum total amount of said metal in said gallium-containing alloy is 10 atomic percent.

14. The method of claim 8 wherein said vanadium alloy contains 0.5 to 6 atomic percent of gallium.

* * * * *